United States Patent
Broekaert

(10) Patent No.: US 7,321,603 B1
(45) Date of Patent: Jan. 22, 2008

(54) METHOD AND SYSTEM FOR REDUCING BIT ERROR RATE IN A HIGH-SPEED FOUR TO ONE TIME DOMAIN MULTIPLEXER

(75) Inventor: Tom Peter Edward Broekaert, Calabasas, CA (US)

(73) Assignee: Inphi Corp., Westlake Village, CA (US)

( * ) Notice: Subject to any disclaimer, the term of this patent is extended or adjusted under 35 U.S.C. 154(b) by 1126 days.

(21) Appl. No.: 10/115,729

(22) Filed: Apr. 3, 2002

(51) Int. Cl.
*H04J 3/02* (2006.01)
(52) U.S. Cl. ............ 370/539; 365/189.02; 365/189.05
(58) Field of Classification Search ................ 370/541, 370/542, 543, 544
See application file for complete search history.

(56) References Cited

U.S. PATENT DOCUMENTS

| | | | | |
|---|---|---|---|---|
| 4,789,984 A * | 12/1988 | Swartz | ........................ | 370/541 |
| 5,129,060 A * | 7/1992 | Pfeiffer et al. | ............... | 345/563 |
| 5,299,193 A * | 3/1994 | Szczepanek | ................ | 370/463 |
| 5,357,144 A * | 10/1994 | Tanaka | ........................ | 327/202 |
| 5,396,127 A * | 3/1995 | Chan et al. | .................... | 326/44 |
| 5,483,540 A * | 1/1996 | Okamura | ..................... | 370/542 |
| 5,550,487 A * | 8/1996 | Lyon | ........................... | 326/33 |
| 5,726,990 A * | 3/1998 | Shimada et al. | ............. | 370/536 |
| 5,913,075 A * | 6/1999 | Beers et al. | .................. | 710/69 |
| 6,215,330 B1 * | 4/2001 | Notthoff | ..................... | 326/130 |
| 6,567,317 B2 * | 5/2003 | Kwak | ..................... | 365/189.02 |
| 2002/0097682 A1 * | 7/2002 | Enam et al. | ................. | 370/241 |
| 2002/0122443 A1 * | 9/2002 | Enam et al. | ................. | 370/537 |
| 2003/0141924 A1 * | 7/2003 | Cosand | ........................ | 327/540 |

* cited by examiner

*Primary Examiner*—Chi Pham
*Assistant Examiner*—Kevin Mew
(74) *Attorney, Agent, or Firm*—SoCal IP Law Group LLP; Steven C. Sereboff; John E. Gunther

(57) ABSTRACT

Method and system for reducing bit error rate (BER) in a high-speed four-to-one time domain multiplexer are disclosed. In one embodiment of the present invention, a keep-alive current is employed in the latches of a four-to-one multiplexer in order to minimize the BER. By adjusting the keep-alive current of the latches in the datapath of the multiplexer, the latch performance can be optimized, thereby achieving minimum BER. Moreover, better latch performance can immunize the multiplexer against small timing misalignment.

18 Claims, 10 Drawing Sheets

A BER simulation setup for a four-to-one time domain multiplexer

A BER simulation setup for a four-to-one time domain multiplexer

FIG. 2  A four-to-one time domain multiplexer

FIG. 3    A two-to-one multiplexer

FIG. 4  A selector circuit

FIG. 5  A first flip-flop

FIG. 6    A second flip-flop

FIG. 7  A latch

METHOD AND SYSTEM FOR REDUCING BIT ERROR RATE IN A HIGH-SPEED FOUR TO ONE TIME DOMAIN MULTIPLEXER

BACKGROUND INFORMATION

1. Field of Invention

The present invention relates to the design of multiplexers, and in particular to the reduction of bit error rate in a high-speed time domain multiplexer.

2. Description of Related Art

Fiber optic communication systems are becoming increasingly popular for data transmission due to their high speed and high data capacity capabilities. Wavelength division multiplexing (WDM) and time division multiplexing (TDM) are used in such fiber optic communication systems to transfer a relatively large amount of data at a high speed. In wavelength division multiplexing, multiple information-carrying signals, each signal having light of a specific restricted wavelength range, may be transmitted along the same optical fiber. In the case of TDM, multiple signals are combined by transmitting each channel sequentially in time over the same fiber.

Particularly, TDM has become the most effective solution to the ever-growing need for bandwidth generated by the growth of the Internet. Consequently, equipment providers need to cost-effectively increase the optical capacity of the transmission equipment in order to support the higher bandwidth.

Furthermore, a multiplexer (mux) that combines a plurality of data streams in a single data output is an important building block of TDM.

However, due to issues such as clock jitter, traditional multiplexers have a relatively high bit error rate (BER), and therefore are not immune to problems such as timing misalignment.

According, there is a need for optimized multiplexers operating with a minimized bit error rate.

SUMMARY OF THE INVENTION

The present invention provides a method and system for a four-to-one time domain multiplexer with a keep-alive current that minimizes the bit error rate (BER).

In one embodiment of the present invention, a keep-alive current is employed in the latches of a four-to-one time domain multiplexer in order to minimize the BER. By adjusting the keep-alive current of the latches in the datapath of the multiplexer, the latch performance can be optimized, and thereby achieving minimum BER. Moreover, better latch performance may immunize the multiplexer against small timing misalignment.

In order to observe the superior performance of four-to-one multiplexers with a keep-alive current, the multiplexer is simulated at higher than standard operating clock frequencies and input clock jitter is added to significantly increase the BER. BER can be obtained in simulation as a function of the keep-alive current, and a clear optimum can be observed in such simulations.

BRIEF DESCRIPTION OF THE DRAWINGS

The accompanying drawings that are incorporated in and form a part of this specification illustrate embodiments of the invention and together with the description, serve to explain the principles of the invention.

DETAILED DESCRIPTION

The following description is presented to enable one of ordinary skill in the art to make and use the invention and is provided in the context of a patent application and its requirements. In the following description, specific nomenclature is set forth to provide a thorough understanding of the present invention. It will be apparent to one skilled in the art that the specific details may not be necessary to practice the present invention. Furthermore, various modifications to the embodiments will be readily apparent to those skilled in the art and the generic principles herein may be applied to other embodiments. Thus, the present invention is not intended to be limited to the embodiments shown but is to be accorded the widest scope consistent with the principles and features described herein.

Figure 1:
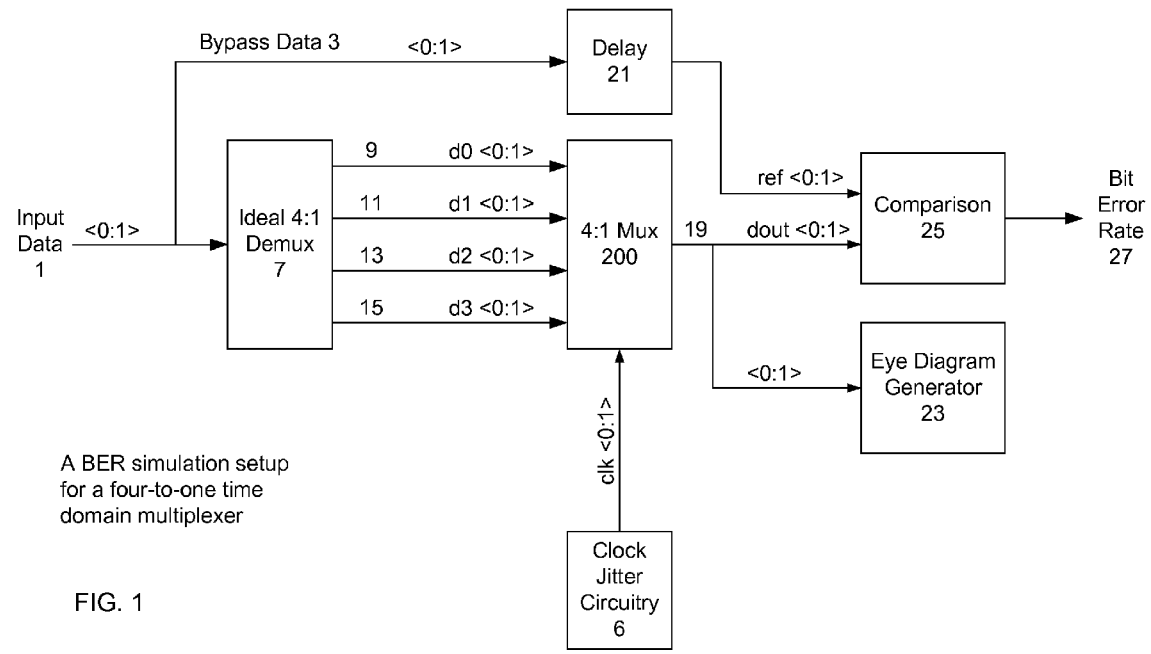
FIG. 1 is a schematic diagram illustrating a BER simulation for a four-to-one time domain multiplexer in accordance to one embodiment of the present invention.

FIG. 1 illustrates a schematic diagram 100 of a BER simulation for a four-to-one time domain multiplexer. Schematic diagram 100 comprises: input data denoted 1, bypass circuitry denoted 3, an ideal one-to-four demultiplexer denoted 7, a four-to-one multiplexer in accordance to one embodiment of the present invention denoted 200, an output data stream denoted 19, a delay block denoted 21, an eye diagram generator denoted 23, a comparison block denoted 25, and a BER output denoted 27.

As shown in FIG. 1, input data 1 is directed in to two separate paths. A first path directs input data 1 into bypass circuitry 3 for later comparison purposes. A second path directs input data 1 into an ideal one-to-four demultiplexer 7. Moreover, an ideal demultiplexer does not introduce any error to the input data.

Subsequently, demultiplexer 7 divides input data into four separate data streams denoted 9, 11, 13, and 15 respectively. The four data streams are then used as four input streams to multiplexer 200, which recombines the four data streams into a single output stream 19.

Meanwhile, input data 1 directed into bypass circuitry 3 remains unchanged but delayed by delay block 21 in order to arrive at comparison block 25 at the same time as output data stream 19.

Comparison block 25 compares the value of input data 1 directed into bypass circuitry 3 to output data stream 19 in order to measure the amount of BER introduced by multiplexer 200. Output stream 27 represents the BER of multiplexer 200. In an ideal situation where BER is 0, the two data streams used for comparison in block 25 should be identical.

Furthermore, a circuitry denoted 6 introduces clock jitter to multiplexer 200 in order to magnify BER for testing purposes.

Figure 2:
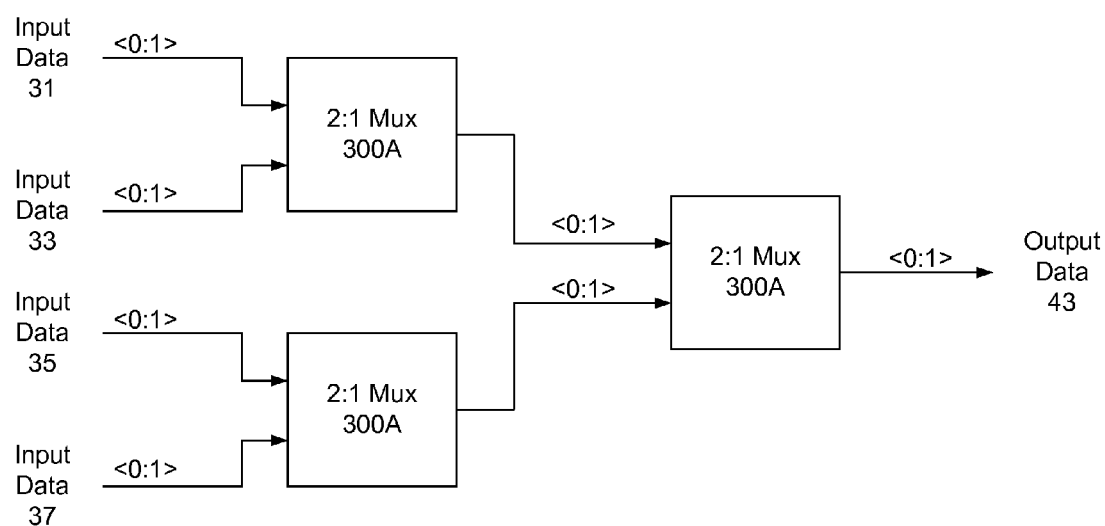
FIG. 2 is a schematic diagram illustrating a four-to-one time domain multiplexer in accordance to one embodiment of the present invention.

FIG. 2 illustrates a schematic diagram 200 of a four-to-one time domain multiplexer. Multiplexer 200 comprises: a first input data stream denoted 31, a second input data stream denoted 33, a third input data stream denoted 35, and a fourth input data stream denoted 37, a first two-to-one multiplexer denoted 300A, a second two-to-one multiplexer denoted 300B, a third two-to-one multiplexer denoted 300C, a first output data stream denoted 39, a second output data stream denoted 41, and a third output data stream denoted 43.

As shown in FIG. 2, multiplexer 200 accepts four input streams 31, 33, 35, and 37 from four sources. Subsequently, input streams 31 and 33 are inputs to two-to-one multiplexer 300A, and input streams 35 and 37 are inputs to two-to-one multiplexer 300B.

Furthermore, multiplexer 300A combines input streams 31 and 33 to create output stream 39, and multiplexer 300B combines input streams 35 and 37 to create output stream 41.

Finally, output streams 39 and 41 are inputs to multiplexer 300C, and multiplexer 300C combines output streams 39 and 41 to create a last output stream 43.

Figure 3:
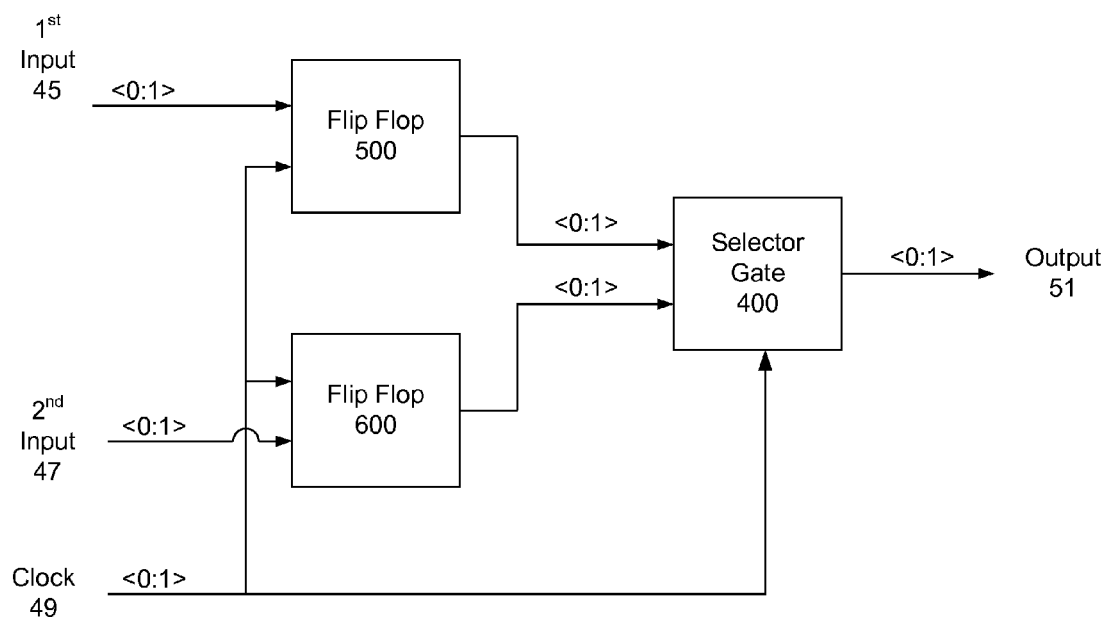
FIG. 3 is a schematic diagram illustrating a two-to-one multiplexer in accordance to one embodiment of the present invention.

FIG. 3 illustrates a schematic diagram 300 of a two-to-one multiplexer. Multiplexer 300 comprises: a first input data stream denoted 45, a second input data stream denoted 47, a clock signal denoted 49, a selector gate denoted 400, a flip-flop denoted 600, and a flip-flop denoted 500.

As shown in FIG. 3, input data stream 45 and clock signal 49 are the two inputs to flip-flop 500, and input data stream 47 and clock signal 49 are the two inputs to flip-flop 600.

Subsequently, the output data streams of flip-flop 500 and flip-flop 600 are inputs to the selector gate 400. The selector gate 400 then combines the two input streams into a single output data stream 51.

Figure 4:
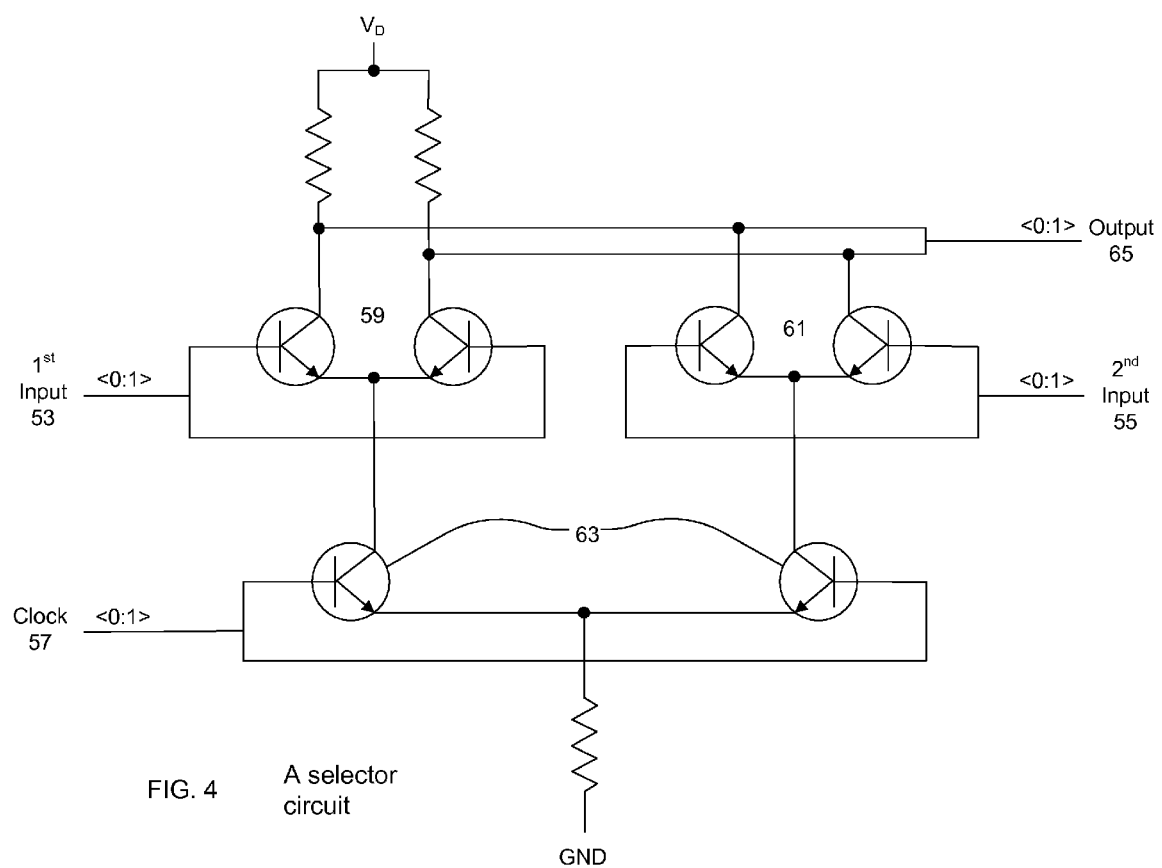
FIG. 4 is a schematic diagram illustrating a first latch in accordance to one embodiment of the present invention.

FIG. 4 illustrates a schematic diagram 400 of a selector gate in accordance to one embodiment of the present invention. The selector gate 400 comprises: a first input data stream denoted 53, a second input data stream denoted 55, a clock denoted 57, a first differential amplifier denoted 59, a second differential amplifier denoted 61, a third differential amplifier denoted 63, and an output data stream denoted 65.

As shown in FIG. 4, selector gate 400 accepts two input streams 53 and 55 from two sources. The two input streams are then amplified with differential amplifiers 59 and 61 respectively and subsequently combined into a single output data stream 65. Furthermore, differential amplifier 63 selects one of the data streams 53 or 55 to propagate to output 65.

Figure 5:
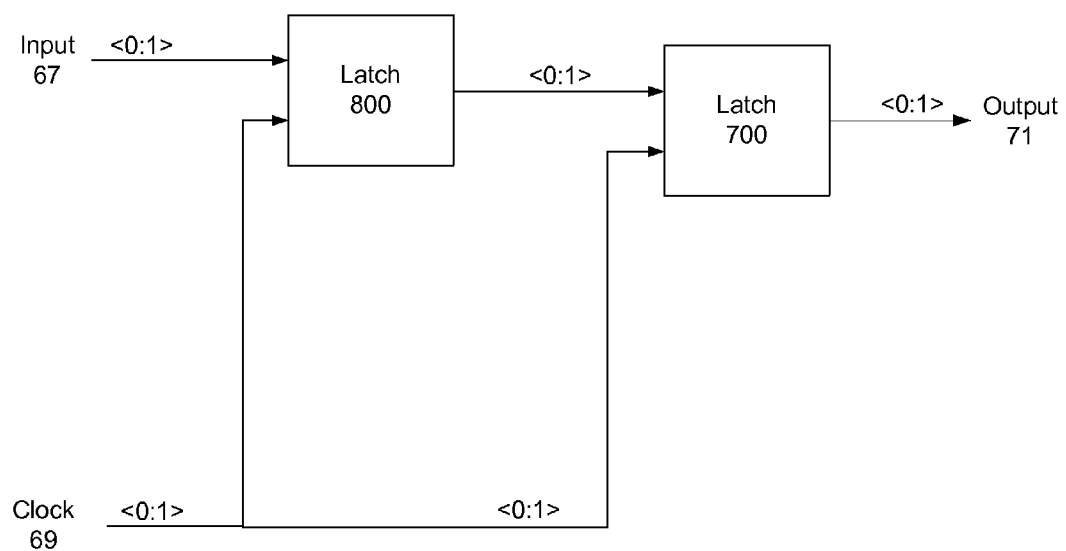
FIG. 5 is a schematic diagram illustrating a first flip-flop in accordance to one embodiment of the present invention.

FIG. 5 illustrates a schematic diagram 500 of a flip-flop in accordance to one embodiment of the present invention. Flip-flop 500 comprises: an input data stream denoted 67, a clock signal denoted 69, a latch denoted 800, a latched denoted 700, and an output stream denoted 71.

As shown in FIG. 5, flip-flop 500 accepts input data stream 67 and clock signal 69. Data stream 67 and clock signal 69 are then fed into latch 800, whose output is an input to latch 700. Subsequently, latch 700 outputs output stream 71.

Figure 6:
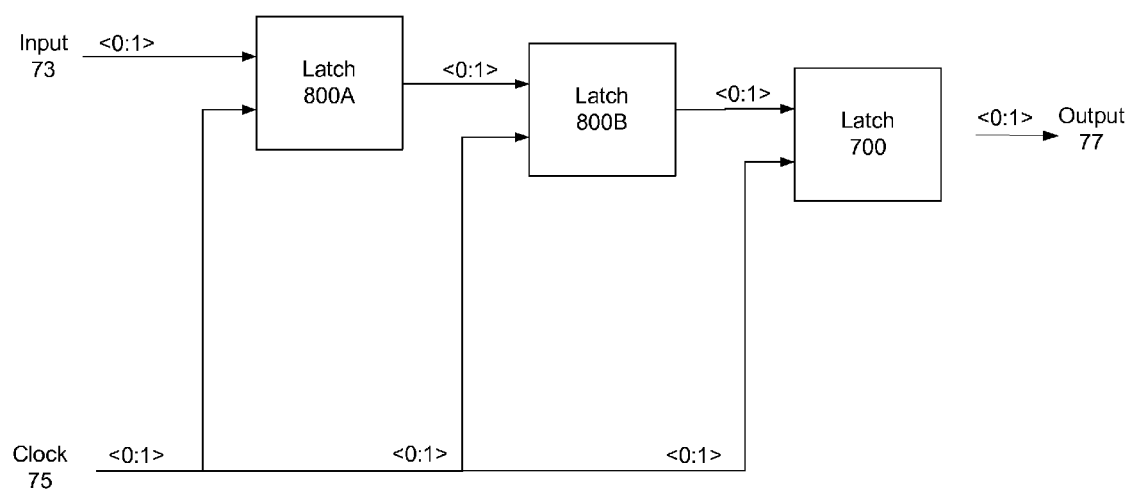
FIG. 6 is a schematic diagram illustrating a second flip-flop in accordance to one embodiment of the present invention.

FIG. 6 illustrates a schematic diagram 600 of a flip-flop in accordance to one embodiment of the present invention. Flip-flop 600 comprises: an input data stream denoted 73, a clock signal denoted 75, a first latch denoted 800A, a second latch denoted 800B, a third latch denoted 700, and an output stream denoted 77.

As shown in FIG. 6, flip-flop 600 accepts input data stream 73 and clock signal 75. Data stream 73 and clock signal 75 are then fed into latch 800A, whose output is an input to latch 800B. The output of 800B is in turn input to latch 700, which outputs output stream 77.

Figure 7:
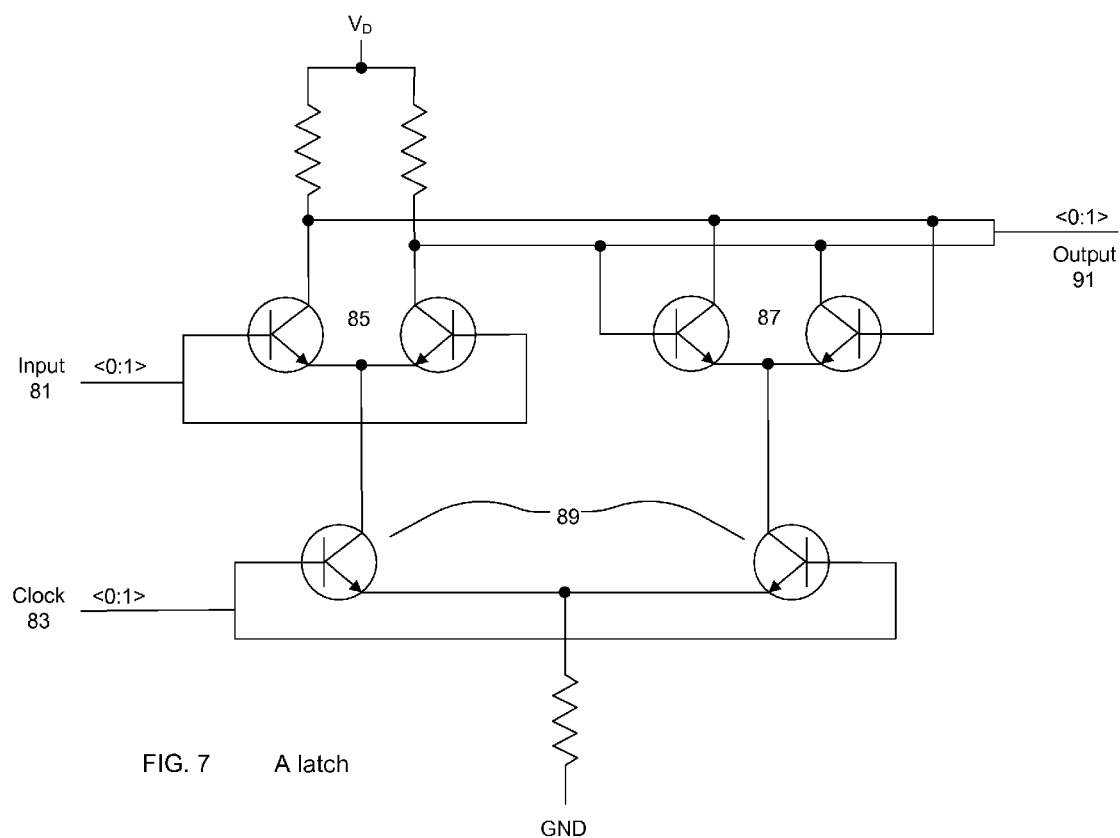
FIG. 7 is a schematic diagram illustrating a second latch in accordance to one embodiment of the present invention.

FIG. 7 illustrates a schematic diagram 700 of a latch in accordance to one embodiment of the present invention. Latch 700 comprises: an input data stream denoted 81, a clock signal denoted 83, a first differential amplifier denoted 85, a second differential amplifier denoted 87, a third differential amplifier denoted 89, and an output data stream denoted 91.

As shown in FIG. 7, latch 700 accepts input data stream 81 and clock signal 83 and outputs output data stream 91.

Figure 8:
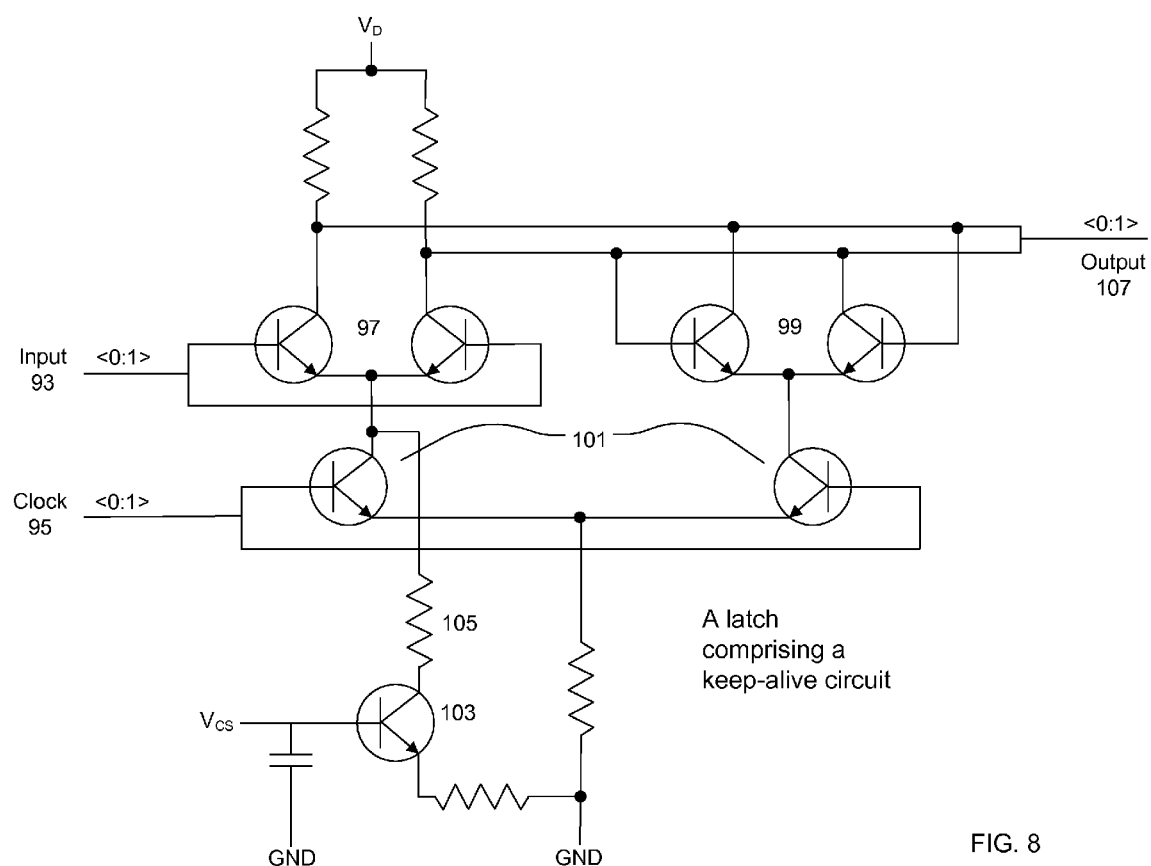
FIG. 8 is a schematic diagram illustrating a third latch comprising a keep-alive circuit in accordance to one embodiment of the present invention.

FIG. 8 illustrates a schematic diagram 800 of a latch in accordance to one embodiment of the present invention. Latch 800 comprises: an input data stream denoted 93, a clock signal denoted 95, a first differential amplifier denoted 97, a second differential amplifier denoted 99, a third differential amplifier denoted 101, a circuitry comprising a transistor and a resistor denoted 103, a keep-alive current denoted 105, and an output data stream denoted 107.

As shown in FIG. 8, latch 800 accepts input data stream 93 and clock signal 95 and outputs output data stream 107.

Moreover, the transistor and resistor of circuitry 103 produce a keep-alive current 105 that ensures that the amplifiers are biased in order to lower BER. Moreover, the resistance can be adjusted to produce a keep-alive current that minimizes BER.

Furthermore, another technique to change the keep-alive current is through a bias voltage, vcs, at the base terminal of the transistor in circuit 103. The change of the vcs voltage allows adjustment of the keep-alive current for performance in situ.

Figure 9A:
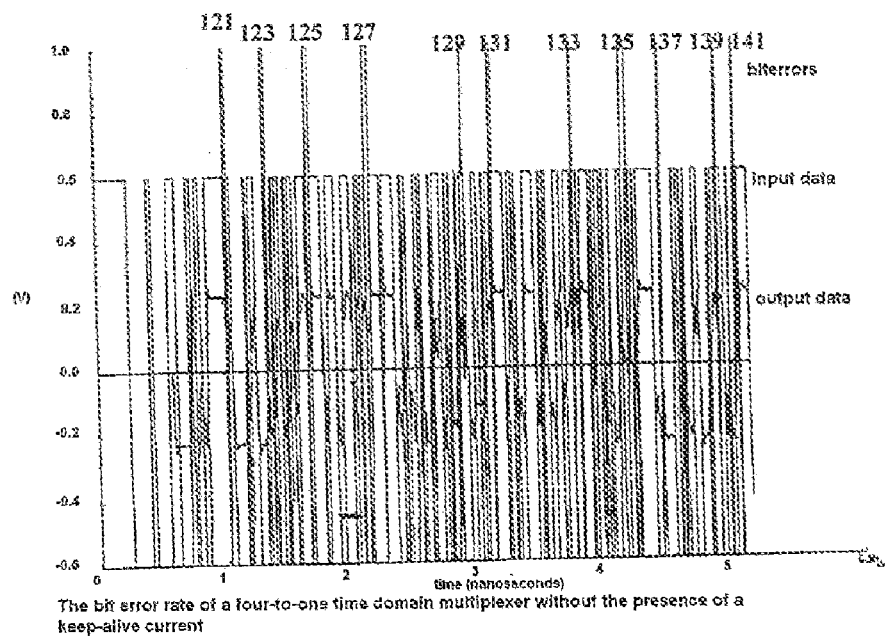
FIG. 9A is a graph illustrating the bit error rate of a four-to-one time domain multiplexer without the presence of a keep-alive current.

FIG. 9A is a graphical illustration of the BER of a four-to-one time domain multiplexer that does not employ a keep-alive current. Each of the spikes denoted 121, 123, 125, 127, 129, 131, 133, 135, 137, 139, and 141 respectively represents a bit error.

Figure 9B:
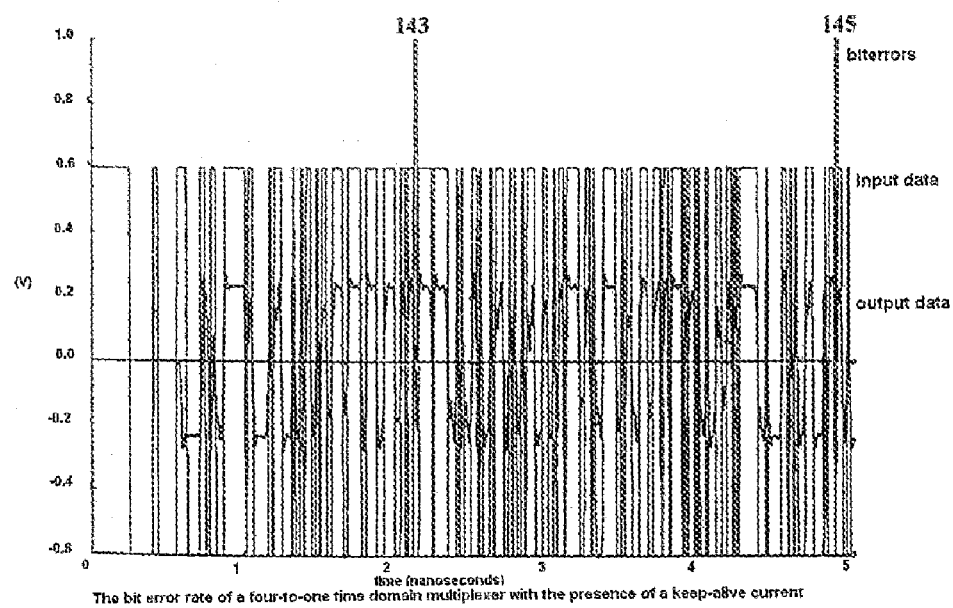
FIG. 9B is a graph illustrating the bit error rate of a four-to-one time domain multiplexer with the presence of a keep-alive current.

FIG. 9B is a graphical illustration of the BER of a four-to-one time domain multiplexer that does employ a keep-alive current. In contrast, FIG. 9B contains only two bit errors denoted 143 and 145.

Figure 10:
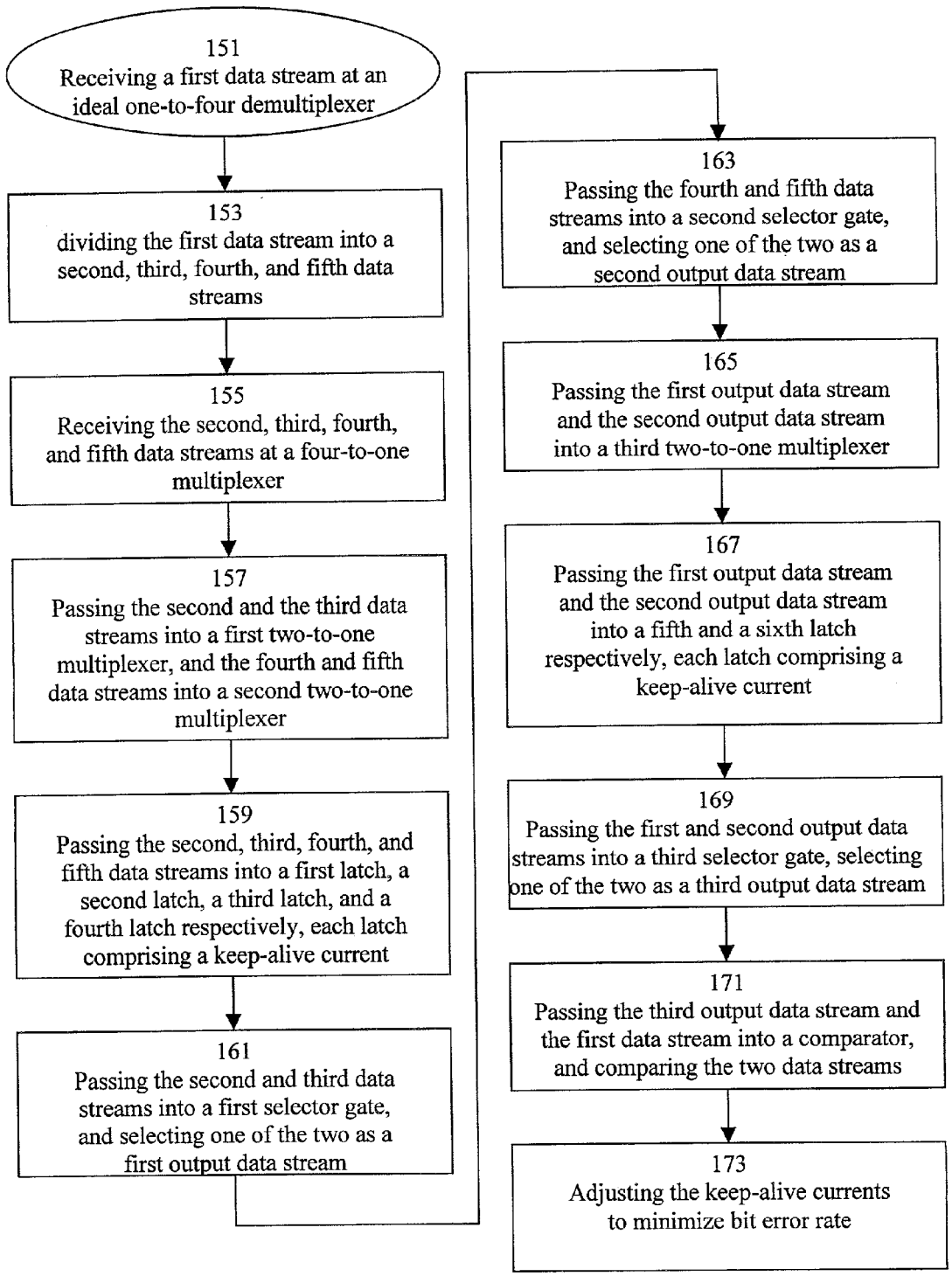
FIG. 10 is a flow diagram illustrating the steps for reducing the BER of a four-to-one time domain multiplexer in accordance to one embodiment of the present invention.

FIG. 10 is a flow diagram illustrating the steps for reducing the BER of a four-to-one time domain multiplexer in accordance to one embodiment of the present invention.

Step 151 illustrates an ideal one-to-four demultiplexer receiving a first data stream as an input. Moreover, an ideal one-to-four demultiplexer is an error-free device.

Subsequently, the demultiplexer divides the first data stream into a second, third, fourth, and fifth data stream as four outputs in step 153.

In step 155, a four-to-one multiplexer receives the second, third, fourth, and fifth data stream as four input data streams.

In step 157, the four-to-one multiplexer passes the second and the third data streams into a first two-to-one multiplexer, and the fourth and fifth data streams into a second two-to-one multiplexer.

Subsequently, the first and second two-to-one multiplexers pass the second, third, fourth, and fifth data streams into a first, second, third and fourth latch respectively in step 159. Moreover, each of the first, second, third, and fourth latch comprises a keep-alive current.

In step 161, the first two-to-one multiplexer passes the second and the third data streams into a first selector gate, and the first selector gate selects one of the two data streams as a first output data stream.

In step 163, the second two-to-one multiplexer passes the fourth and the fifth data streams into a second selector gate, and the second selector gate selects one of the two data streams as a second output data stream.

In step 165, the first and second two-to-one multiplexers then pass the first and second output data streams as two input data streams into a third two-to-one multiplexer.

In step 167, the third two-to-one multiplexer passes the first and second output data streams into a fifth and a sixth latch respectively. Moreover, each latch comprises a keep-alive current.

In step 169, the third two-to-one multiplexer passes the first and second output data streams into a third selector gate, and the third selector gate selects one of the two data streams as a third output data stream.

In step 171, the third output data stream and the first data streams are passed into a comparator where the two are compared.

In step 173, the keep-alive currents are adjusted to minimize the BER, depending on the result of the comparison.

Although the invention has been described in connection with several embodiments, it is understood that this invention is not limited to the embodiments disclosed, but is capable of various modifications that would be apparent to a person skilled in the art.

For example, eye diagram generator denoted 23 shown in FIG. 1 is implemented for convenience, the BER data may be observed without generating any eye diagrams or plots.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the arts to best utilize the invention and various embodiments with various modifications as are suited to the particular use contemplated. It is intended that the scope of the invention be defined by the Claims appended hereto and their equivalents.

I claim:

1. A high speed time domain four-to-one multiplexer, comprising:
   a first two-to-one multiplexer having a first input for receiving a first data source, a second input for receiving a second data source, a clock input for receiving a clock signal, and a first output, the first two-to-one multiplexer further comprising:
   a first selector gate; and
   a first plurality of latches disposed as a first flip-flop and a second flip-flop, wherein the first flip-flop comprises a first latch in the first plurality of latches generating a first keep-alive current and a second latch in the first plurality of latches comprising a second keep-alive current;
   a second two-to-one multiplexer having a third input for receiving a third data source, a fourth input for receiving a fourth data source, a second output, and a second plurality of latches, a first latch in the second plurality of latches generating a third keep-alive current; and
   a third two-to-one multiplexer having a fifth input coupled to the first output of the first two-to-one multiplexer, a sixth input coupled to the second output of the second two-to-one multiplexer, a third output, and a third plurality of latches, a first latch in the third plurality of latches generating a fourth keep-alive current.

2. The multiplexer of claim 1, wherein the first keep-alive current is produced by a combination of a transistor connected to a resistor serially.

3. The multiplexer of claim 2, wherein the first keep-alive current is adjustable by varying a resistance of the resistor.

4. The multiplexer of claim 2, wherein the first keep-alive current is adjustable by varying a voltage in a base terminal of the transistor.

5. The multiplexer of claim 1, wherein the second flip-flop further comprises a third latch in the first plurality of latches comprising a fifth keep-alive current, a fourth latch in the first plurality of latches comprising a sixth keep-alive current, and a fifth latch in the first plurality of latches.

6. A method for reducing a bit error rate, comprising:
   demultiplexing a first data stream into a second data stream, a third data stream, a fourth data stream, and a fifth data stream;
   multiplexing the second data stream and the third data stream;
   multiplexing the fourth data stream and the fifth data stream;
   latching the second data stream in a latch comprising a first keep-alive current; and
   adjusting the first keep-alive current to minimize the bit error rate.

7. The method of claim 6, further comprising:
   latching the third data stream in a latch comprising a second keep-alive current;
   latching the fourth data stream in a latch comprising a third keep-alive current; and
   latching the fifth data stream in a latch comprising a fourth keep-alive current.

8. The method of claim 7, further comprising adjusting a combination of the first keep-alive current, the second keep-alive current, the third keep-alive current, and/or the fourth keep-alive current to reduce the bit error rate.

9. The method of claim 8, further comprising passing the second data stream and the third data stream into a first selector gate, and selecting either the second data stream or the third data stream as a first output data stream.

10. The method of claim 9, further comprising passing the fourth data stream and the fifth data stream into a second selector gate, and selecting either the fourth data stream or the fifth data stream as a second output data stream.

11. The method of claim 10, further comprising multiplexing the first output data stream and the second output data stream.

12. The method of claim 11, further comprising latching the first output data stream to generate a fifth keep-alive current, and latching the second output data stream to generate a sixth keep-alive current.

13. The method of claim 12, further comprising selecting either the first output data stream or the second output data stream as a third output data stream.

14. The method of claim 13, further comprising comparing the third output data stream and the first data stream.

15. The method of claim 14, further comprising adjusting a combination of the first keep-alive current, the second keep-alive current, the third keep-alive current, and/or the fourth keep-alive current to reduce the bit error rate.

16. A method for reducing a bit error rate of a four-to-one time domain multiplexer, comprising:

receiving a first data stream in an error-free one-to-four demultiplexer;

dividing the first data stream into a second, third, fourth, and fifth data stream;

receiving the second, third, fourth, and fifth data streams at the four-to-one multiplexer;

passing the second data stream and the third data stream into a first two-to-one multiplexer;

passing the fourth data stream and the fifth data stream into a second two-to-one multiplexer;

passing the second, third, fourth and fifth data streams into a first latch, a second latch, a third latch, and a fourth latch respectively, each latch in the first, second, third, and fourth latches comprising a keep-alive current;

passing the second data stream and the third data stream into a first selector gate;

selecting between the second data stream and the third data stream as a first output data stream;

passing the fourth data stream and the fifth data stream into a second selector gate;

selecting between the fourth data stream and the fifth data stream as a second output data stream;

passing the first output data stream and the second output data stream into a third two-to-one multiplexer;

passing the first output data stream and the second output data stream into a fifth latch and a sixth latch respectively, each latch in the fifth and sixth latches comprising a keep-alive current;

passing the first output data stream and the second output data stream into a third selector gate;

selecting between the first output data stream and the second output data stream as a third output data stream;

comparing the third output data stream to the first data stream; and adjusting the keep-alive currents to minimize bit error rate.

17. The method of claim 16, wherein each of the latches comprises a transistor and a resistor that produces each keep-alive current.

18. The method of claim 17, wherein the keep-alive currents is adjusted by varying the resistance of the resistors in the latches.

* * * * *